United States Patent
Lin et al.

(10) Patent No.: US 10,840,138 B2
(45) Date of Patent: Nov. 17, 2020

(54) SELECTIVELY ETCHED SELF-ALIGNED VIA PROCESSES

(71) Applicant: Applied Materials, Inc., Santa Clara, CA (US)

(72) Inventors: Yung-Chen Lin, Gardena, CA (US); Qingjun Zhou, San Jose, CA (US); Ying Zhang, Sunnyvale, CA (US); Ho-yung Hwang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/132,655

(22) Filed: Sep. 17, 2018

(65) Prior Publication Data

US 2019/0088543 A1    Mar. 21, 2019

Related U.S. Application Data (60) Provisional application No. 62/560,093, filed on Sep. 18, 2017.

(51) Int. Cl.
*H01L 21/00* (2006.01)
*H01L 21/768* (2006.01)
(Continued)

(52) U.S. Cl.
CPC .... *H01L 21/76897* (2013.01); *H01L 21/0271* (2013.01); *H01L 21/0337* (2013.01); *H01L 21/31116* (2013.01); *H01L 21/32136* (2013.01); *H01L 21/76829* (2013.01); *H01L 21/76843* (2013.01)

(58) Field of Classification Search
None
See application file for complete search history.

(56) References Cited

U.S. PATENT DOCUMENTS

| | | | | |
|---|---|---|---|---|
| 5,592,024 A | * | 1/1997 | Aoyama | H01L 21/76801 257/751 |
| 6,869,879 B1 | * | 3/2005 | Ryan | H01L 21/31144 216/17 |

(Continued)

FOREIGN PATENT DOCUMENTS

| KR | 20050071026 | 7/2005 |
|---|---|---|
| WO | 2016105350 | 6/2016 |

OTHER PUBLICATIONS

PCT/US2018/051469 , "International Search Report and Written Opinion", dated Jan. 9, 2019, 12 pages.

*Primary Examiner* — Reema Patel
(74) *Attorney, Agent, or Firm* — Kilpatrick Townsend & Stockton LLP (57) ABSTRACT

Processing methods may be performed to expose a contact region on a semiconductor substrate. The methods may include selectively recessing a first metal on a semiconductor substrate with respect to an exposed first dielectric material. The methods may include forming a liner over the recessed first metal and the exposed first dielectric material. The methods may include forming a second dielectric material over the liner. The methods may include forming a hard mask over selected regions of the second dielectric material. The methods may also include selectively removing the second dielectric material to expose a portion of the liner overlying the recessed first metal.

15 Claims, 9 Drawing Sheets

(51) Int. Cl.
   *H01L 21/033*    (2006.01)
   *H01L 21/311*    (2006.01)
   *H01L 21/027*    (2006.01)
   *H01L 21/3213*   (2006.01)

(56) References Cited

U.S. PATENT DOCUMENTS

| | | | |
|---|---|---|---|
| 2004/0178169 A1* | 9/2004 | Deshpande | H01L 21/0276 216/12 |
| 2009/0321940 A1 | 12/2009 | Kunkel et al. | |
| 2015/0091181 A1 | 4/2015 | Li et al. | |
| 2016/0148869 A1 | 5/2016 | Schenker et al. | |
| 2017/0330761 A1* | 11/2017 | Chawla | H01L 21/0337 |

* cited by examiner

SELECTIVELY ETCHED SELF-ALIGNED VIA PROCESSES

CROSS-REFERENCE TO RELATED APPLICATIONS

This application claims the benefit of U.S. Provisional Application No. 62/560,093, filed Sep. 18, 2017, and which is hereby incorporated by reference in its entirety for all purposes.

TECHNICAL FIELD

The present technology relates to semiconductor systems, processes, and equipment. More specifically, the present technology relates to systems and methods for forming and etching material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may deform the remaining material. Dry etch processes may penetrate into intricate features and trenches, but may not provide acceptable top-to-bottom profiles. As device sizes continue to shrink in next-generation devices, selectivity may play a larger role when only a few nanometers of material are formed in a particular layer, especially when the material is critical in the transistor formation. Many different etch process selectivities have been developed between various materials, although standard selectivities may no longer be suitable at current and future device scale.

Thus, there is a need for improved systems and methods that can be used to produce high quality devices and structures. These and other needs are addressed by the present technology.

SUMMARY

Processing methods may be performed to expose a contact region on a semiconductor substrate. The methods may include selectively recessing a first metal on a semiconductor substrate with respect to an exposed first dielectric material. The methods may include forming a liner over the recessed first metal and the exposed first dielectric material. The methods may include forming a second dielectric material over the liner. The methods may include forming a hard mask over selected regions of the second dielectric material. The methods may also include selectively removing the second dielectric material to expose a portion of the liner overlying the recessed first metal.

In some embodiments, the methods may also include forming a third dielectric material over the second dielectric material. The third dielectric material and the first dielectric material may be the same material. Selectively removing the second dielectric material may include selectively removing the third dielectric material and the second dielectric material. A process chemistry used for the selective removal may be characterized by a selectivity toward the second dielectric material that is greater than a selectivity toward the third dielectric material. The methods may also include forming a photoresist pattern overlying the hard mask. The methods may also include performing a first selective removal of a portion of the third dielectric material. The first selective removal may not expose the second dielectric material. The methods may also include removing the photoresist pattern subsequent the first selective removal operation. The methods may also include performing a second selective removal operation to remove a second portion of the third dielectric material and the second dielectric material. The first selective removal operation and the second selective removal operation may be substantially anisotropic. At least one of the first selective removal operation and the second selective removal operation may include a dry etch using a plasma enhanced fluorine-containing precursor.

Embodiments of the present technology may also include additional methods of exposing a contact region on a semiconductor substrate. The methods may include selectively recessing a metal on a semiconductor substrate with respect to an exposed first dielectric material to form a gap. The methods may include forming a second dielectric material overlying the metal within the gap to a height of the first dielectric material. The methods may include forming a third dielectric material overlying the second dielectric material and the first dielectric material. The methods may include forming a hard mask over selected regions of the second dielectric material. The methods may also include selectively removing the third dielectric material and the second dielectric material to expose the recessed metal.

In some embodiments, the third dielectric material and the first dielectric material may be the same material. A process chemistry used for the selective removal may be characterized by a selectivity toward the second dielectric material that is greater than a selectivity toward the third dielectric material. The methods may also include forming a photoresist pattern overlying the hard mask. The methods may also include performing a first selective removal of a portion of the third dielectric material. The first selective removal may not expose the second dielectric material. The methods may also include removing the photoresist pattern subsequent the first selective removal operation. The methods may also include performing a second selective removal operation to remove a second portion of the third dielectric material and the second dielectric material. The first selective removal operation and the second selective removal operation may be substantially anisotropic. At least one of the first selective removal operation and the second selective removal operation may include a dry etch using a plasma enhanced fluorine-containing precursor.

Such technology may provide numerous benefits over conventional systems and techniques. For example, the greater contact exposure may reduce edge-placement error. Additionally, the selective etch processes may obviate the inclusion of liner materials or additional patterning operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During back-end-of-line processing, metal and other conductive materials may be filled into layers of structures on a substrate. As transistor structures continue to shrink, and aspect ratios continue to increase, the contact landing area exposed between layers may become more critical. To maintain sufficient conductivity, a certain area of contact may be required. During lithography and patterning, small deficiencies with the area of photoresist and patterning may cause edge-placement error, where subsequent etch processes are offset, and do not sufficiently expose underlying contact pads. Additionally, many conventional etch processes, such as reactive ion etching ("RIE") may not have adequate selectivity to maintain intricate critical dimensions. Despite being a relatively anisotropic process, RIE etches may still have selectivity causing sidewall losses. Although budgeting for this loss may be considered during formation, such as with over-formation of material, because regions within the structure being etched have different dimensions, calculating for the amount of loss in one area may not be suitable for the amount of loss in a larger area. Accordingly, although 5 nm of loss may occur in one section that is budgeted, loss in a larger section of 6-7 nm may still occur, causing mismatches during fabrication.

Additionally, RIE processes produce an etch byproduct or polymer residue that is generally removed with a wet etching process. This wet etch often over-etches sidewall protection layers beyond critical dimensions, which can cause problems with formation and spacing of adjacent transistor layers, and further etches low-k nitride spacers and inter-layer dielectric oxide. Because the selectivity of RIE processes may be in the range of 10:1, critical contact materials and other structural materials may be overly etched. The present technology may overcome these issues by using a self-aligned patterning process that ensures substantial or complete access to underlying metal recesses. Additionally, by utilizing particular materials and etch chemistries, improved structures may be formed that reduce queue times and may reduce the number of material layers.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

Figure 1:
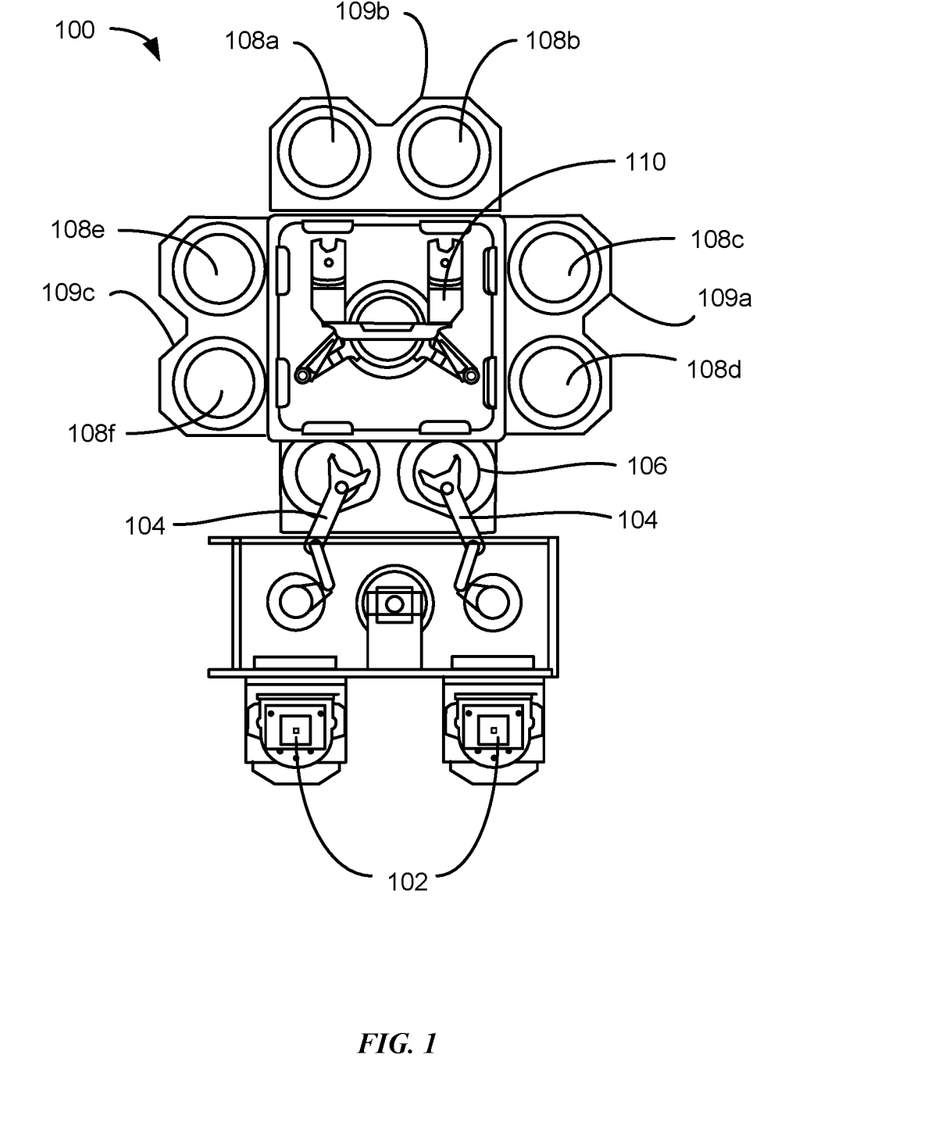
FIG. 1 shows a top plan view of an exemplary processing system according to embodiments of the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
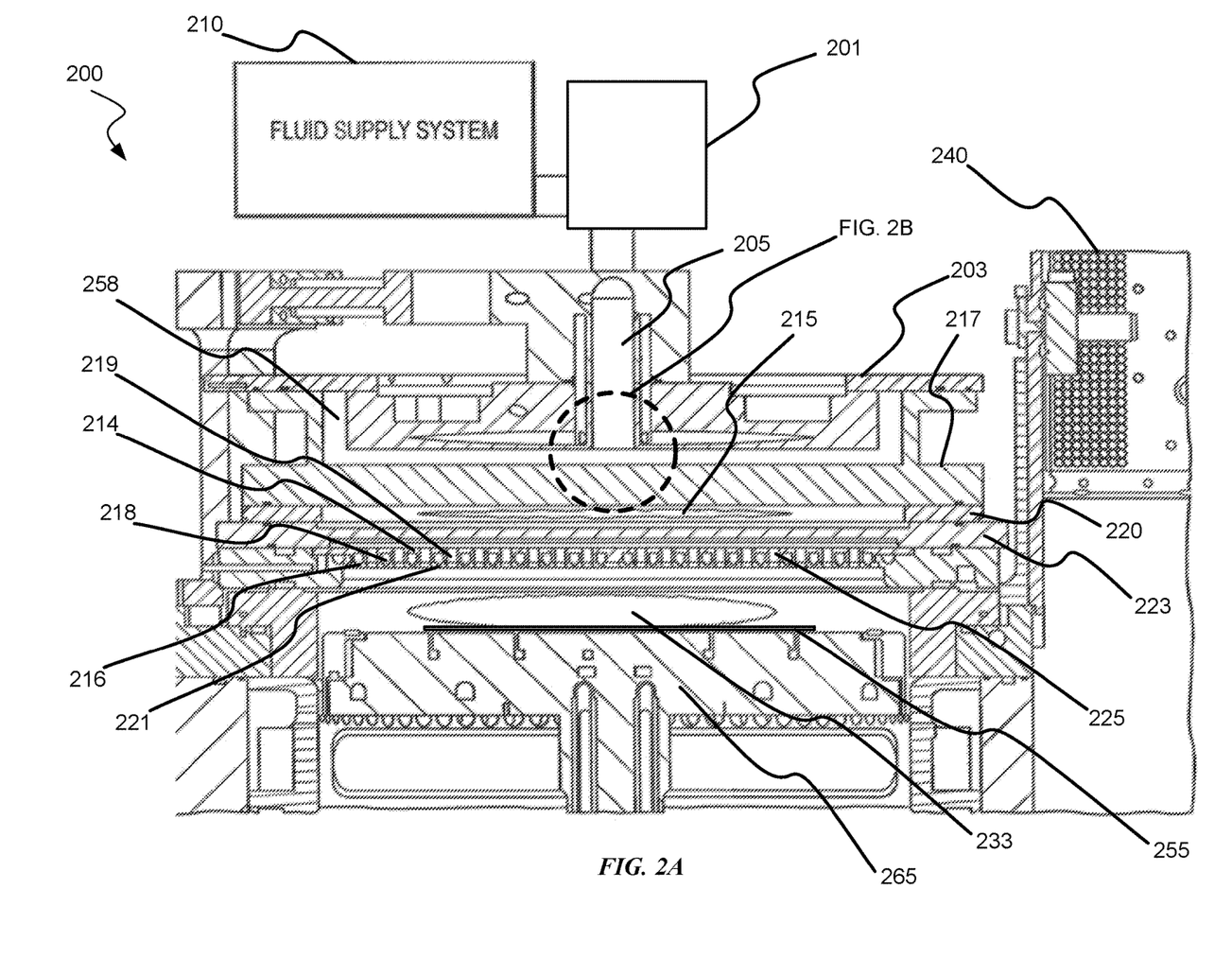
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
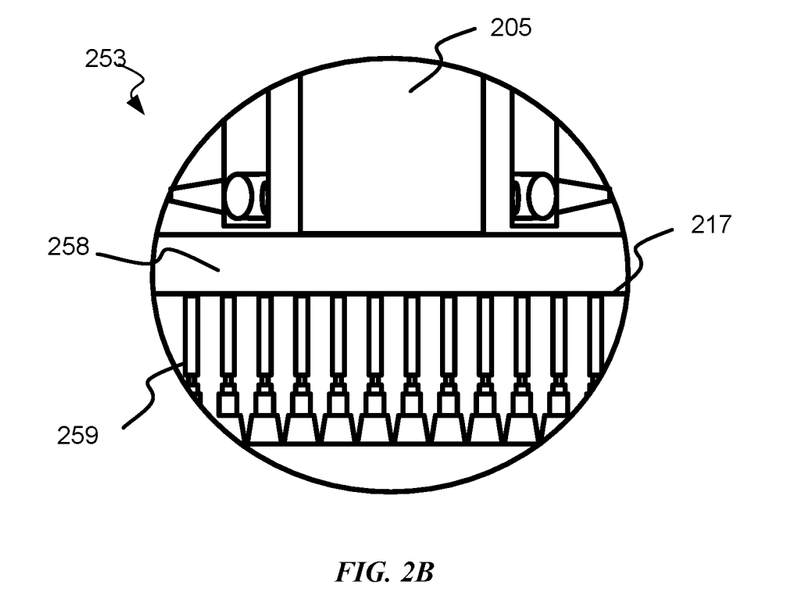
FIG. 2B shows a detailed view of an exemplary showerhead according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
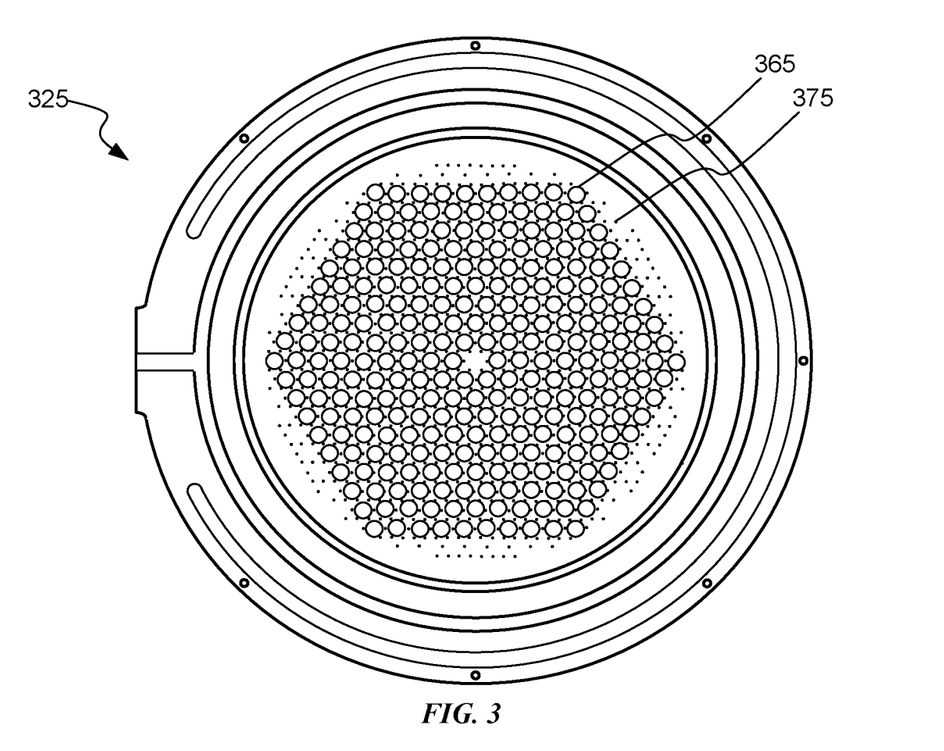
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
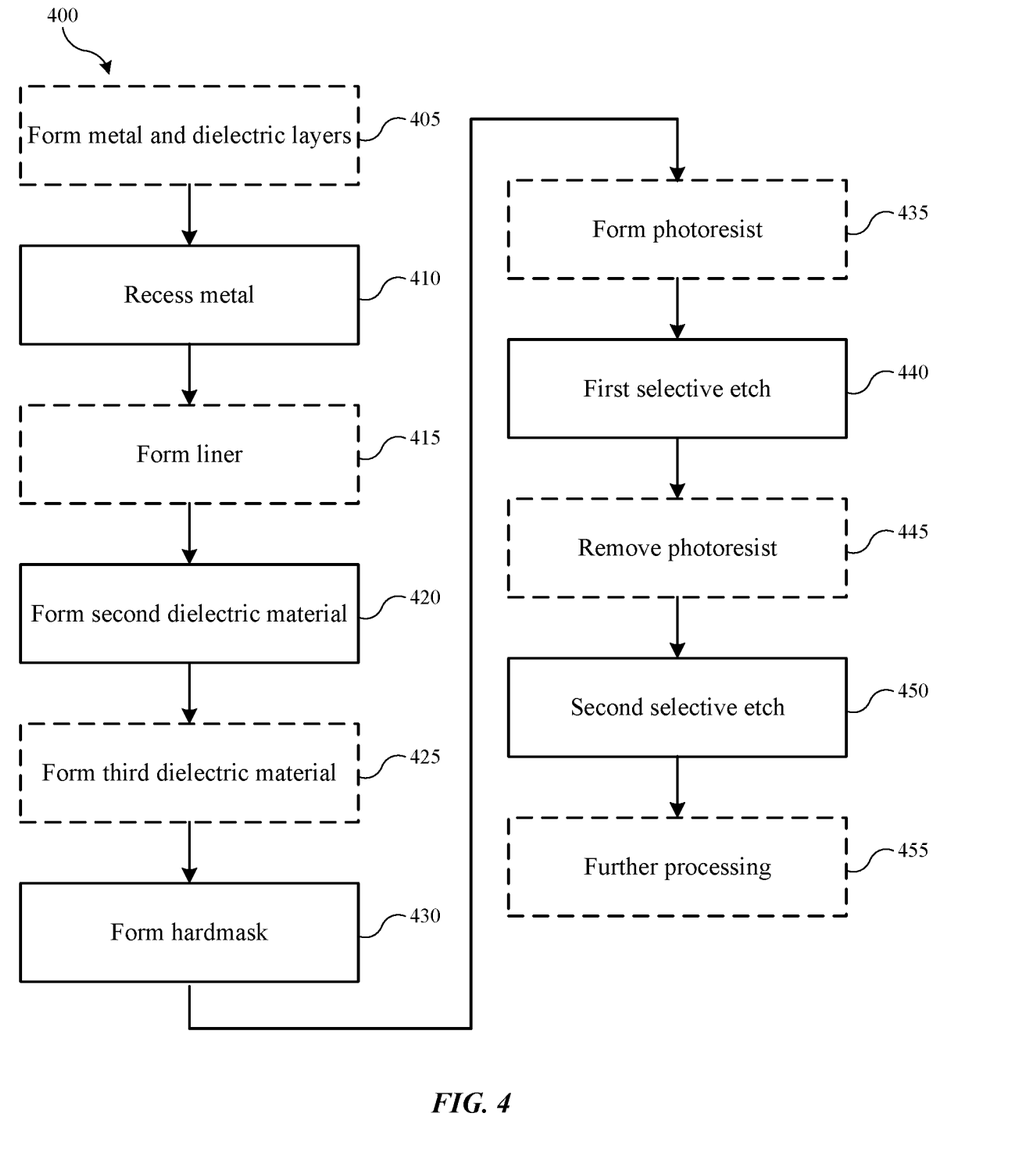
FIG. 4 shows selected operations in a method of exposing a contact region according to embodiments of the present technology.

FIG. 4 illustrates an etching method 400, many operations of which may be performed, for example, in the chamber 200 as previously described. Method 400 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 400 describes the operations shown schematically in FIG. 5, the illustrations of which will be described in conjunction with the operations of method 400. It is to be understood that FIG. 5 illustrates only partial schematic views, and a substrate may contain any number of transistor sections having aspects as illustrated in the figures.

Figure 5A:
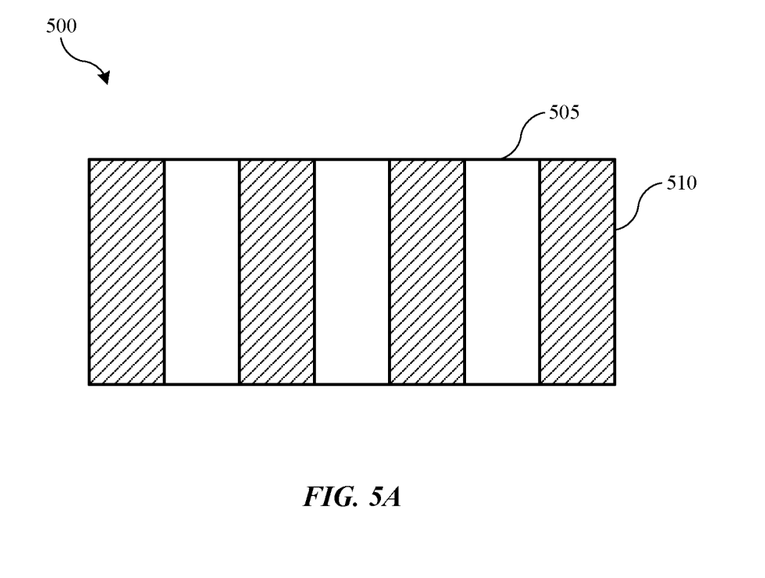
FIGS. 5A-5I illustrate schematic cross-sectional views of substrate materials on which selected operations are being performed according to embodiments of the present technology.

Method 400 may involve optional operations to develop the semiconductor structure to a particular fabrication operation. As illustrated in FIG. 5A, the semiconductor structure may represent a device after a chemical-mechanical polishing operation has been performed over a formed structure in operation 405, or some other removal operation to form a planar or substantially planar top surface of semiconductor structure 500. As illustrated, structure 500 may include sections of a first metal 505 as well as sections of a first dielectric material 510. Structure 500 may illustrate a mid-section of a semiconductor device, and may have a number of transistor structures formed beneath the illustrated sections. For example, metal 505 may include metallization contacting underlying structures not shown. Exemplary metals may include a number of conductive materials including cobalt, copper, ruthenium, tungsten, or any other material that may be useful for providing conductivity between structural layers. Dielectric material 510 may be any number of dielectrics, including interlayer dielectrics such as low-k materials, flowable oxides, ultra-low-k materials, or any other material that may be utilized between and within layers of a semiconductor substrate.

Figure 5B:
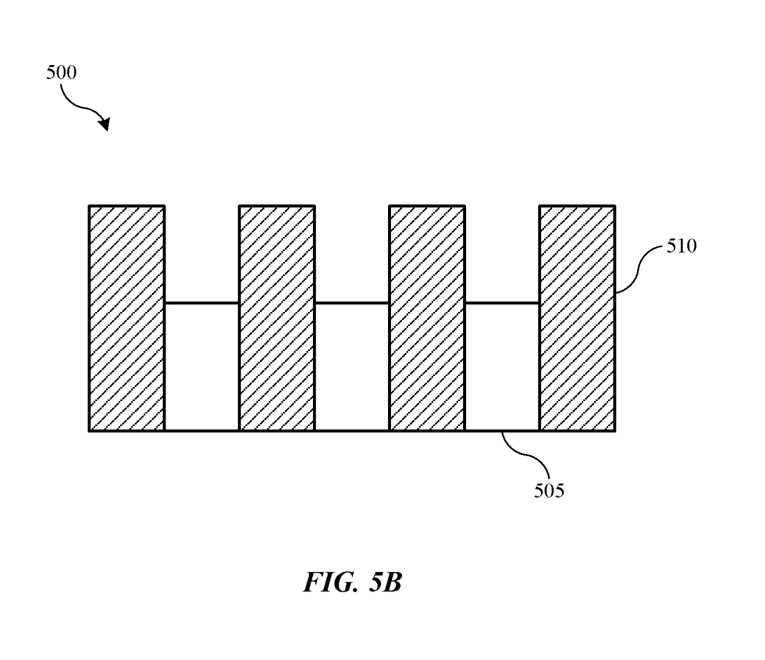

At operation 410, metal material 505 may be selectively recessed from between the layers of dielectric material 510. As illustrated in FIG. 5B, metal material may be recessed to a height that may be the design specification height of the metal. For example, one or both of metal 505 and dielectric 510 may be formed to a height greater than a final design height of the material. This may allow removal and additional formation operations to recess and build additional structures selectively to produce the final desired structure. For example, the initially formed metal may be formed to a height greater than a design specification, and may be formed at least about 1.1 times the design specification height. In some embodiments, the metal 505 may initially be formed to a height of at least about 1.3 times the design specification height, or may be formed to a height at least about 1.5 times, at least about 1.7 times, at least about 2.0 times, at least about 2.3 times, at least about 2.5 times, at least about 2.7 times, at least about 3.0 times, at least about 3.5 times, at least about 4.0 times, or more depending on the number of operations being performed in the processes. As one non-limiting example, where a design height of 50 nm is specified, the height of the structure may be 100 nm, and recessing the metal may reduce the height by 50 nm.

The recessing operation 410 may be performed in chamber 200 previously described, which may allow a metal-selective etch to be performed, which may remove metal 505, while maintaining the first dielectric material 510, for example. The process may be performed using a dry etch process utilizing a plasma or remote plasma, which may produce plasma effluents of a halogen-containing precursor, such as, for example, a fluorine-containing precursor, or a chlorine-containing precursor. The process may also utilize a hydrogen-containing precursor in embodiments, which may also be included in the remote plasma or may bypass the remote plasma to interact with radical halogen-containing plasma effluents in the processing region.

The process may be performed below about 10 Torr in embodiments, and may be performed below or about 5 Torr in embodiments. The process may also be performed at a temperature below about 100° C. in embodiments, and may be performed below about 50° C. As performed in chamber 200, or a variation on this chamber, or in a different chamber capable of performing similar operations, the process may remove metal material 505 down to a specified height between sections of dielectric material 510. In embodiments, the process may have a selectivity towards metal material 505 with respect to interlayer dielectric material 510 greater than or about 10:1, and may have a selectivity greater than or about 50:1, greater than or about 100:1, greater than or about 200:1, greater than or about 300:1, greater than or about 400:1, or greater than or about 500:1 in embodiments. A similar etch process, or similar selectivities may be used or achieved for any of the subsequent removal processes discussed further below in other operations of method 400.

Figure 5C:
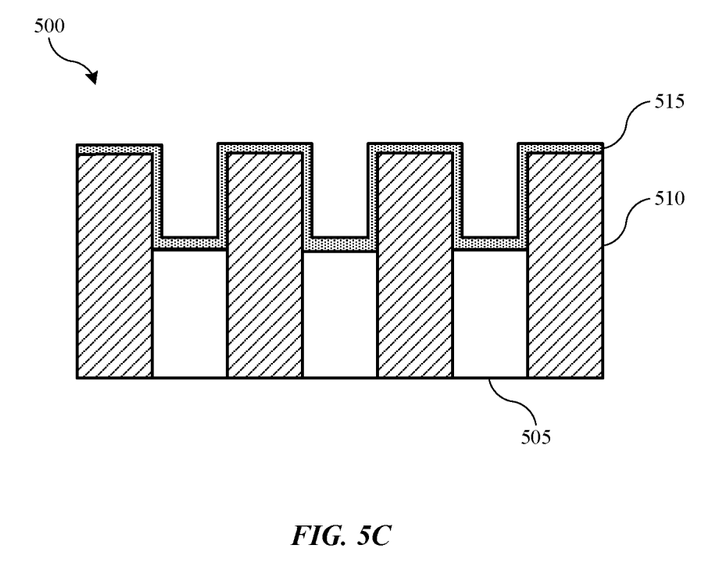

A liner material 515 may be formed across the structure 500 at optional operation 415, as illustrated in FIG. 5C. The liner material may cover all exposed areas, and may be formed over recessed metal 505 as well as dielectric material 510. Liner 515 may be formed to act as an etch stop layer in later operations discussed below. Additionally, depending on materials utilized in subsequent operations, such as the second and/or third dielectric materials, liner 515 may not be included in some embodiments. The differences in subsequent operations based on the inclusion or exclusion of liner 515 will be identified at each operation. Liner 515 may be any number of materials, and in embodiments, may be silicon nitride, silicon carbonitride, metal oxide materials, including aluminum oxide, or other materials that may be formed over the patterned structure. In some embodiments liner material 515 may be formed conformally over the recessed structure to allow a minimal layer of less than a few microns to be formed. Accordingly, in some embodiments liner 515 may be formed in an atomic-layer deposition process, although other processes may be used that may produce conformal layers.

Figure 5D:
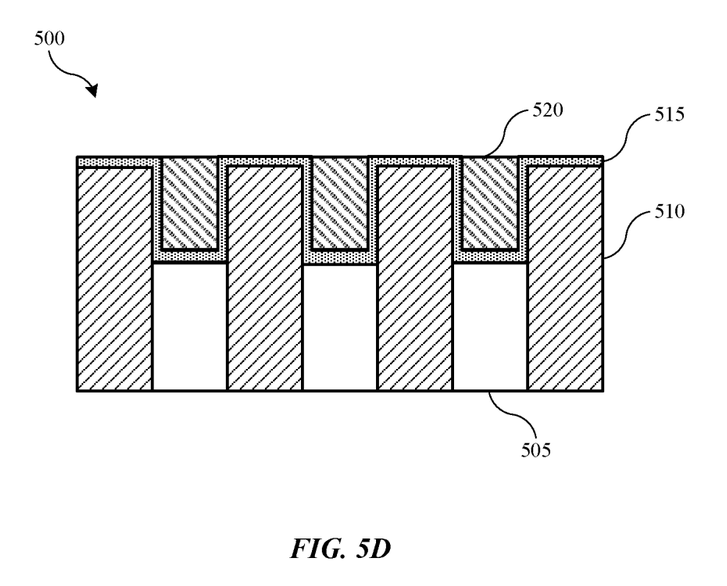

Subsequent formation of the liner 515, when formed, a gap fill may be performed in operation 420. As illustrated in FIG. 5D, second dielectric material 520 may be formed or deposited over the liner layer 515, and within the trenches formed by the recessed metal 505. A chemical mechanical polishing operation may be performed to planarize the structure and expose the liner layer over the raised portions of the structure, such as the dielectric material 510. The second dielectric material 520 may be a silicon-containing material, and may be silicon oxide, silicon oxycarbide, or some other dielectric material, such as an additional interlayer dielectric as noted above. The second dielectric material 520 may be deposited by any number of mechanisms including in a flowable chemical vapor deposition process, for example. In some embodiments, second dielectric 520 may be different than first dielectric 510, however in other embodiments the two dielectric materials may be the same.

Figure 5E:
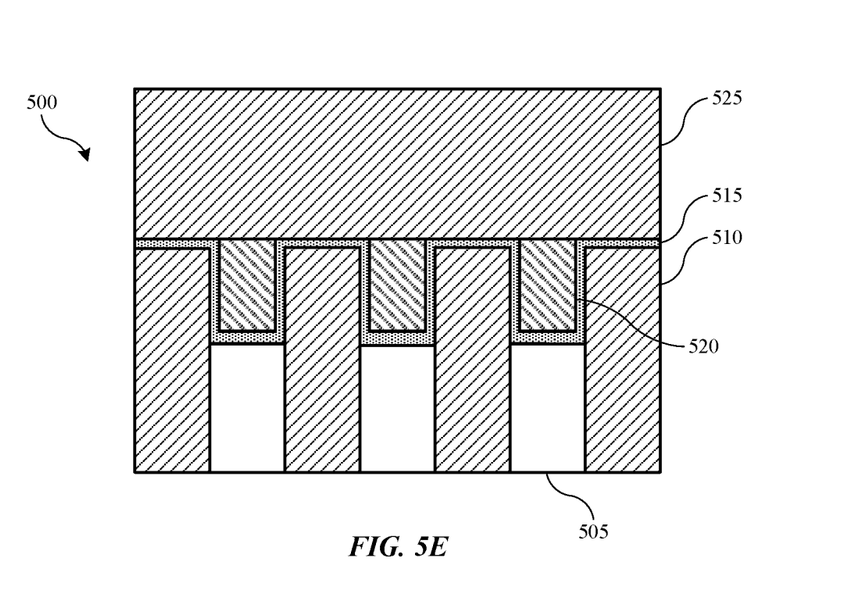

A third dielectric material 525 may be formed overlying the second dielectric material at optional operation 425. As illustrated in FIG. 5E, the third dielectric material may be formed overlying the second dielectric material 520 as well as the liner material 515. The third dielectric material may be formed to a height in consideration of subsequent steps. For example, third dielectric material 525 may be formed to a greater height than a design specification of a second metal layer to be formed overlying the metal 505 in the next level of the device structure. Accordingly, a height of third dielectric 525 may be based on a design specification height of a subsequent level, and third dielectric 525 may be formed to any of the heights above that design specification as was previously described for the initial structure. In embodiments, third dielectric material 525 may be any of the previously identified interlayer dielectric materials, and in some embodiments may be the same as first dielectric material 510.

Third dielectric material 525 formation is noted as an optional operation, which may be impacted by the formation of the liner layer 515 or not. For example, if liner layer 515 is not formed, second dielectric material may be included overlying the metal 505, and third dielectric material may be formed overlying first and second dielectric materials. This may facilitate removal operations discussed further below. However, when liner layer 515 is formed, third dielectric material 525 may be removed, or alternatively second dielectric material 520 may be removed, and only a single dielectric may be formed overlying the liner 515. This may be because the liner may operate as an etch stop in later fabrication, which may allow only a single dielectric material to be formed as will be described further below with respect to the removal operations.

Figure 5F:
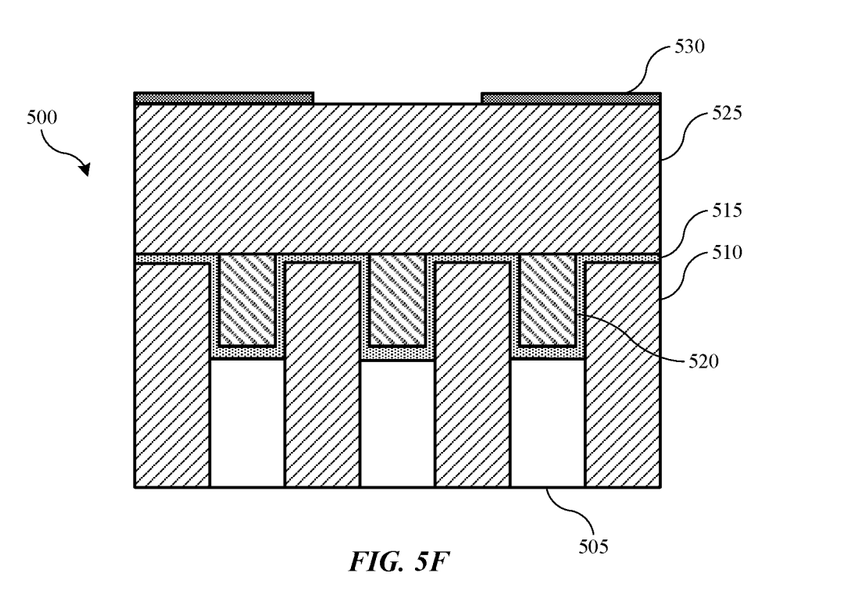

At operation 430, a mask material 530 may be formed over the third dielectric material 525 as illustrated in FIG. 5F. The mask material 530 may be any material suitable for use in an etching process that will provide selectivity towards dielectric material 525. In one example, the mask material 525 may be a hardmask that is patterned over certain regions of third dielectric material 525. For example, mask material 520 may include titanium nitride, tungsten carbide, or a variety of other materials that may be maintained during subsequent removal operations. The mask material may be patterned to form exposures of underlying metal 505 or second dielectric material 520. The mask may be patterned with a larger opening than a width of the metal 505 in preparation for a self-aligned process. For example, as illustrated, mask material 530 may be formed to extend over partial regions of dielectric material 520 fully exposing second dielectric material 520 in one or more regions. This may allow subsequent processing to form metal extensions in one region, without contacting other metal regions, which may be contacted in later operations, or maintained from a prior formation process.

Figure 5G:
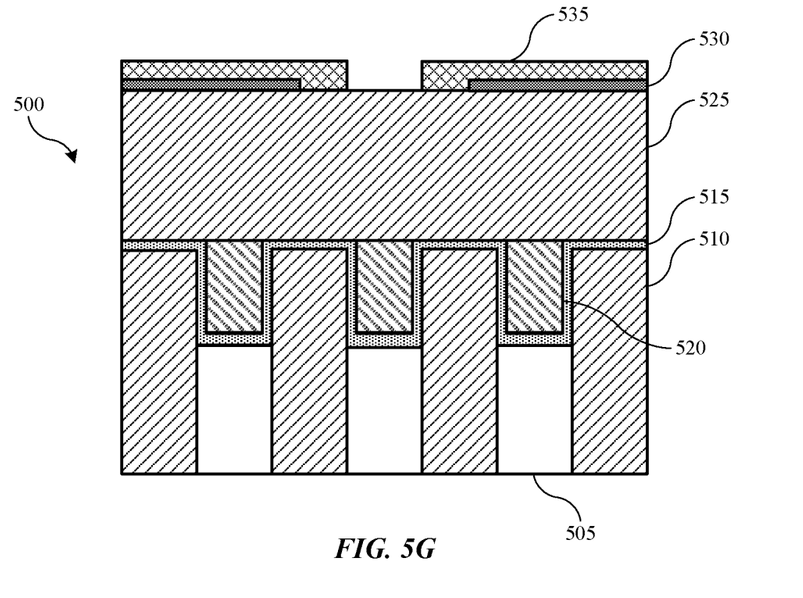
Figure 5H:
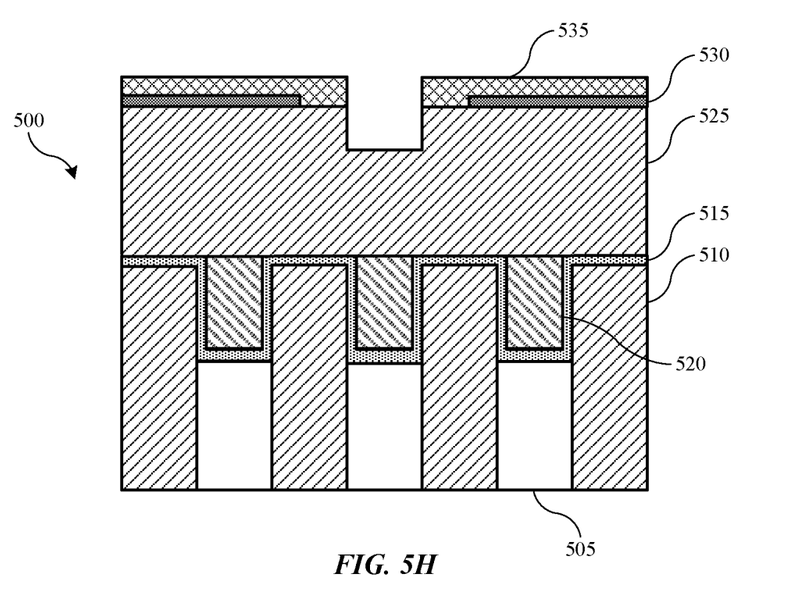

Formation of a photoresist pattern 535 may be performed in optional operation 435 as illustrated in FIG. 5G. The photoresist may extend over mask material 530 and may contact third dielectric material 525 beyond coverage of the mask material. This may allow a dual damascene etch process to be performed to form a trench and via structure that may extend towards a section of metal 505 in one or more regions. The photoresist may be formed to maintain an oversized contact hole, which may allow the intervening layers to guide the self-aligned process. This may ensure that the entire region of metal 505 is exposed in subsequent patterning, without requiring an isotropic process. A transfer etch process may be performed with a first selective etch at operation 440 to remove a portion of the third dielectric material as illustrated in FIG. 5H.

The transfer process may selectively remove a first region of the third dielectric material 525, which may form the via portion of the dual damascene structure. The depth of etch may be dependent on the height of the second dielectric material 520, and may be up to a depth equivalent to about 100% the height of the second dielectric material 520 or less. In some embodiments the height may be less than 100% the height of the second dielectric material 520 based on a selectivity between the third dielectric material and the second dielectric material of a subsequent etch process, and in embodiments may be less than or about 90%, less than or about 80%, less than or about 70%, less than or about 60%, less than or about 50%, less than or about 40%, less than or about 30%, less than or about 20%, less than or about 10%, or less. Regardless of the depth of the first selective etch, etch process 440 may not expose the second dielectric material, or may not be performed to a level of liner 515 or first dielectric material 510. Once the etch has been performed to sufficient depth, photoresist 535 may be stripped at optional operation 445.

Figure 5I:
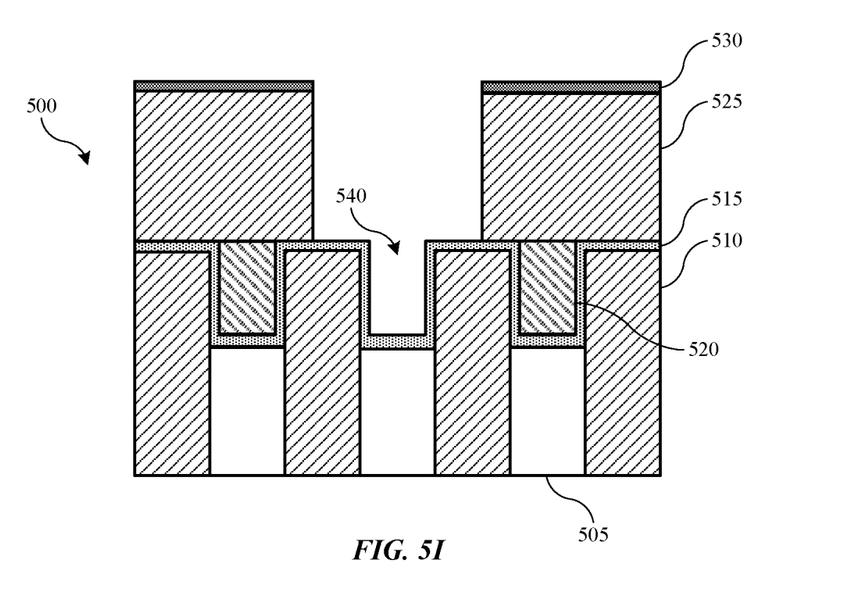

A second selective removal operation may be performed at operation 450, as illustrated in FIG. 5I. As shown, the second selective removal process may be performed to anisotropically remove all of third dielectric material between regions of hard mask material 530, and may further remove all gapfill material or second dielectric material 520 in one or more regions. An etching operation may be performed as previously described in chamber 200 or some other etching chamber capable of selectively removing the interlayer dielectric materials. The process may be performed with chemistries selected to remove both dielectric materials with respect to the hard mask material 530. The chemistries may also be selected, along with the previously deposited dielectric materials, to provide a selectivity towards second dielectric material 520 that is higher than third dielectric material 525. The removal may expose liner material 515 and produce a gap 540 where second dielectric material 520 has been removed. Additionally, the removal may expose metal 505 in embodiments in which a liner 515 has not been formed.

By having a selectivity towards second dielectric material 520 over third dielectric material 525, the second dielectric material 520 may be removed much faster when exposed. Depending on the selectivity towards the liner, this may not be of great concern when the liner is present. However, when the liner is not formed, the selectivity between second dielectric and third dielectric, which may be the same or similar as first dielectric, may define the edge profile of sections 510 of first dielectric material. When a liner is not formed over the metal and first dielectric material, if the selectivity of the second selective etch is relatively low, then structures 510 may etch as third dielectric material 525 is removed. However, as the selectivity improves between the second dielectric and the third or first dielectric material, a less beveled or etched edge of sections 510 may be produced.

For example, if the gap fill of second dielectric material 520 is about 50 nm, if a selectivity between second dielectric material 520 is at least 50:1 relative to third dielectric material, and/or first dielectric material, then a minimal amount of third or first dielectric material may be removed once second dielectric material 520 has been exposed. Consequently, once exposed, second dielectric material 520 may be fully removed with limited additional removal of other exposed dielectric materials. Additionally, in some embodiments a selectivity of the second etching operation between second dielectric material 520 and third and/or first dielectric material may be greater than or about 100:1, greater than or about 200:1, greater than or about 300:1, greater than or about 400:1, greater than or about 500:1, or more. Accordingly, profiles as illustrated may be produced with or without a liner material in embodiments of the present technology.

Method 400 may include additional processing at optional operation 455. For example, additional operations may include removing or punching through liner 515 when formed, and may include forming additional metallization within the formed trench and via. By utilizing selective etches, such as in chamber 200, process flows may be performed that limit the number of layers and operations in the method. Additionally, a self-aligned process may be performed that fully exposes one or more underlying contact regions from a group of metal sections at a particular level of a semiconductor device. Additionally, profiles and amounts of contact materials may be adjusted or maintained based on the present technology, which may improve conductivity or reduce resistance due to the residual etch stop layer material of traditional processes. Finally, by using plasma enhanced etching operations for each of the selective removal operations, the selective removal operations of method 400 may be performed without reactive-ion etching or wet etching in embodiments of the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of exposing a contact region on a semiconductor substrate, the method comprising:
   selectively recessing a first metal on a semiconductor substrate with respect to an exposed first dielectric material;
   forming a liner over the recessed first metal and the exposed first dielectric material;
   forming a second dielectric material over the liner;
   forming a third dielectric material over the second dielectric material, wherein the third dielectric material and the first dielectric material are the same material;
   forming a hard mask over selected regions of the second dielectric material;
   performing a first selective removal of a portion of the third dielectric material, wherein the first selective removal does not expose the second dielectric material; and
   selectively removing the second dielectric material to expose a portion of the liner overlying the recessed first metal, wherein selectively removing the second dielectric material comprises selectively removing the third dielectric material and the second dielectric material.

2. The method of exposing a contact region of claim 1, wherein a process chemistry used for the selective removal is characterized by a selectivity toward the second dielectric material that is greater than a selectivity toward the third dielectric material.

3. The method of exposing a contact region of claim 1, further comprising forming a photoresist pattern overlying the hard mask.

4. The method of exposing a contact region of claim 3, further comprising removing the photoresist pattern subsequent the first selective removal operation.

5. The method of exposing a contact region of claim 4, further comprising performing a second selective removal operation to remove a second portion of the third dielectric material and the second dielectric material.

6. The method of exposing a contact region of claim 5, wherein the first selective removal operation and the second selective removal operation are anisotropic.

7. The method of exposing a contact region of claim 5, wherein the first selective removal operation or the second selective removal operation comprises a dry etch using a plasma enhanced fluorine-containing precursor.

8. A method of exposing a contact region on a semiconductor substrate, the method comprising:
   selectively recessing a metal on a semiconductor substrate with respect to an exposed first dielectric material to form a gap;
   forming a second dielectric material overlying the metal within the gap to height of the first dielectric material;
   forming a third dielectric material overlying the second dielectric material and the first dielectric material;
   forming a hard mask over selected regions of the second dielectric material; and
   selectively removing both of the third dielectric material and the second dielectric material to expose the recessed metal during a single removal operation, wherein a process chemistry used for the selective removal is characterized by a selectivity toward the second dielectric material that is greater than a selectivity toward the third dielectric material.

9. The method of exposing a contact region of claim 8, wherein the third dielectric material and the first dielectric material are the same material.

10. The method of exposing a contact region of claim 8, further comprising forming a photoresist pattern overlying the hard mask.

11. The method of exposing a contact region of claim 10, further comprising performing a first selective removal of a portion of the third dielectric material, wherein the first selective removal does not expose the second dielectric material.

12. The method of exposing a contact region of claim 11, further comprising removing the photoresist pattern subsequent the first selective removal operation.

13. The method of exposing a contact region of claim 12, further comprising performing a second selective removal operation to remove a second portion of the third dielectric material and the second dielectric material.

14. The method of exposing a contact region of claim 13, wherein the first selective removal operation and the second selective removal operation are anisotropic.

15. The method of exposing a contact region of claim 13, wherein the first selective removal operation or the second selective removal operation comprises a dry etch using a plasma enhanced fluorine-containing precursor.

* * * * *